(12) United States Patent
Zhan, II et al.

(10) Patent No.: US 9,976,231 B2
(45) Date of Patent: May 22, 2018

(54) FIXED CUTTER DRILL BIT CUTTER ELEMENTS INCLUDING HARD CUTTING TABLES MADE FROM CVD SYNTHETIC DIAMONDS

(71) Applicant: National Oilwell DHT, L.P., Conroe, TX (US)

(72) Inventors: Guodong Zhan, II, Spring, TX (US); Michael Scott Nixon, Pearland, TX (US)

(73) Assignee: NATIONAL OILWELL DHT, L.P., Conroe, TX (US)

( * ) Notice: Subject to any disclaimer, the term of this patent is extended or adjusted under 35 U.S.C. 154(b) by 211 days.

(21) Appl. No.: 14/443,502

(22) PCT Filed: Nov. 18, 2013

(86) PCT No.: PCT/US2013/070512
§ 371 (c)(1),
(2) Date: May 18, 2015

(87) PCT Pub. No.: WO2014/081654
PCT Pub. Date: May 30, 2014

(65) Prior Publication Data
US 2015/0299901 A1    Oct. 22, 2015

Related U.S. Application Data

(60) Provisional application No. 61/728,920, filed on Nov. 21, 2012.

(51) Int. Cl.
B24D 3/00    (2006.01)
B24D 18/00   (2006.01)
(Continued)

(52) U.S. Cl.
CPC .......... *C30B 33/06* (2013.01); *B24D 18/0009* (2013.01); *B24D 99/005* (2013.01);
(Continued)

(58) Field of Classification Search
USPC .......................................... 51/307, 293, 309
See application file for complete search history.

(56) References Cited

U.S. PATENT DOCUMENTS 5,011,509 A    4/1991  Frushour
5,364,423 A   11/1994  Bigelow et al.
(Continued)

FOREIGN PATENT DOCUMENTS

EP    0272418 A2    6/1988
EP    0419087 A1    3/1991
(Continued)

OTHER PUBLICATIONS

PCT/US2013/070512 International Search Report and Written Opinion dated Feb. 10, 2014 (14 p.).
(Continued)

*Primary Examiner* — James E McDonough
(74) *Attorney, Agent, or Firm* — Conley Rose, P.C.

(57) ABSTRACT

Systems and methods of forming components from CVD single crystal diamonds that can withstand high temperatures and pressures, for example, in a mining and/or drilling environment. This may be accomplished by transforming a graphite powder by hot-filament chemical vapor deposition (HFCVD) into a CVD single diamond crystal powder, growing a plurality of CVD single diamond crystals on a planar surface of a substrate or on a dowel. In one example, if a substrate is used as the growth surface, the plurality of CVD single crystals grow in at least one layer on the substrate and at least a portion of the plurality of CVD single diamond crystals are removed from the substrate in the form
(Continued)

of a plurality of discrete intact sheets of CVD single diamond crystals, stacked in a mold, and sintered, for example, to form a CVD single crystal diamond table.

6 Claims, 6 Drawing Sheets

(51) Int. Cl.

| | | |
|---|---|---|
| *C30B 33/06* | (2006.01) | |
| *C30B 25/00* | (2006.01) | |
| *C23C 16/27* | (2006.01) | |
| *C30B 29/04* | (2006.01) | |
| *E21B 10/567* | (2006.01) | |
| *C30B 33/00* | (2006.01) | |
| *B24D 99/00* | (2010.01) | |
| *C30B 25/10* | (2006.01) | |
| *E21B 10/42* | (2006.01) | |
| *E21B 10/55* | (2006.01) | |
| *B24D 3/02* | (2006.01) | |
| *B24D 11/00* | (2006.01) | |
| *C09K 3/14* | (2006.01) | |
| *E21B 10/54* | (2006.01) | |

(52) U.S. Cl.
CPC ............ *C23C 16/271* (2013.01); *C30B 25/00* (2013.01); *C30B 25/10* (2013.01); *C30B 29/04* (2013.01); *C30B 33/00* (2013.01); *E21B 10/42* (2013.01); *E21B 10/55* (2013.01); *E21B 10/567* (2013.01); *E21B 2010/545* (2013.01)

(56) References Cited

U.S. PATENT DOCUMENTS

| | | |
|---|---|---|
| 5,387,447 A | 2/1995 | Slutz et al. |
| 5,437,891 A | 8/1995 | Anthony et al. |
| 5,491,002 A | 2/1996 | Slutz |
| 5,954,147 A | 9/1999 | Overstreet et al. |
| 6,068,070 A | 5/2000 | Scott |
| 7,517,588 B2 | 4/2009 | Frushour |
| 7,594,968 B2 | 9/2009 | Hemley et al. |
| 7,595,110 B2 | 9/2009 | Frushour |
| 2005/0115774 A1 | 6/2005 | Nieto et al. |
| 2006/0147631 A1 | 7/2006 | Lev et al. |
| 2007/0029114 A1 | 2/2007 | Middlemiss |
| 2008/0099768 A1* | 5/2008 | Scarsbrook ............ C30B 25/20 257/77 |
| 2010/0320006 A1 | 12/2010 | Fan et al. |
| 2012/0255237 A1* | 10/2012 | Frushour ............ B24D 18/0009 51/309 |

FOREIGN PATENT DOCUMENTS

| | | |
|---|---|---|
| EP | 0464611 A1 | 1/1992 |
| EP | 1760165 A2 | 3/2007 |
| RU | 2389833 C2 | 5/2010 |
| WO | 94/26953 A1 | 11/1994 |
| WO | 2011/029773 A1 | 3/2011 |

OTHER PUBLICATIONS

Response to Written Opinion dated Feb. 10, 2014 and Article 19 Amendments for PCT/US2013/070512; Response dated Apr. 9, 2014 (10 p.).
Tsai, Hung-Yin, et al., "Study on Diamond Thin Film Deposited on Graphite Substrate by Difference Pretreatment Methods," Journal of Ceramic Processing Research, vol. 13, Special 1, pp. s82-s88 (2012) (7 p.).
Karve, Priyadarshini, et al., "CVD Diamond, Diamond-Like Carbon, and Carbonitride Coatings," Chemical Vapor Deposition, Jul. 1, 2001, pp. 331-347 (9 p.).
Russian Office Action dated May 29, 2017, for Russian Application No. 2015119799 (8 p.).
English Translation of Russian Office Action dated May 29, 2017, for Russian Application No. 2015119799 (9 p.).
U.K. Examintion Report dated Feb. 1, 2017, for U.K. Application No. 1509001.2 (4 p.).
Schwartz S., et al., "CVD-Diamond Single Crystal Growth," Journal of Crystal Growth, vol. 271 (2004), pp. 425-434 (10 p.).
Eres, Gyula, "Chemical Vapor Deposition Processing of Diamond Films," Annual DOE Peer Review Meeting, DOE Power Electronics Research Program, Washington, DC, Sep. 30, 2008 (20 p.).
Dai, Z., et al., "Heteroepitaxial Diamond Film Growth: the A-Plane Sapphire-Iridium System," vol. 13, Issues 4-8, Apr.-Aug. 2004, pp. 552-556, 14th European Conference on Diamond, Diamond-Like Materials, Carbon Nanotubes, Nitrides and Silicon Carbide (1 p.).
U.K. Examination Report dated Sep. 20, 2017, for U.K. Application No. 1509001.2 (4 p.).

* cited by examiner

FIXED CUTTER DRILL BIT CUTTER ELEMENTS INCLUDING HARD CUTTING TABLES MADE FROM CVD SYNTHETIC DIAMONDS

CROSS-REFERENCE TO RELATED APPLICATIONS

This application is a 35 U.S.C. § 371 national stage application of PCT/US2013/070512 filed Nov. 18, 2013 and entitled "Fixed Cutter Drill Bit Cutter Elements Including Hard Cutting Tables Made from CVD Synthetic Diamonds," which claims benefit of U.S. provisional patent application Ser. No. 61/728,920 filed Nov. 21, 2012, and entitled "Fixed Cutter Drill Bit Cutter Elements Including Hard Cutting Tables Made From CVD Synthetic Diamonds," each of which is hereby incorporated herein by reference in its entirety.

STATEMENT REGARDING FEDERALLY SPONSORED RESEARCH OR DEVELOPMENT

Not applicable.

BACKGROUND

The present disclosure relates generally to earth-boring drill bits used to drill a borehole for the ultimate recovery of oil, gas, or minerals. More particularly, the present disclosure relates to drag bits and to an improved cutting structure for such bits. Still more particularly, the present disclosure relates to cutter elements for use on drag bits and methods of manufacturing such cutter elements.

An earth-boring drill bit is connected to the lower end of a drill string and is rotated by rotating the drill string from the surface, with a downhole motor, or by both. With weight-on-bit (WOB) applied, the rotating drill bit engages the formation and proceeds to form a borehole along a predetermined path toward a target zone.

Many different types of drill bits and cutting structures for bits have been developed. Two common types of drill bits are roller cone bits and fixed cutter bits, also known as drag bits. Fixed cutter bit include a plurality of blades angularly spaced about the bit face. The blades generally project radially outward along the bit body and form flow channels there between. Cutter elements are grouped and mounted on several blades, typically arranged in rows along the leading edge of each blade. However, the configuration or layout of the cutter elements on the blades may vary widely, depending on a number of factors.

The cutter elements mounted to the blades of a fixed cutter bit are typically formed of extremely hard materials. In the typical fixed cutter bit, each cutter element comprises an elongate cylindrical tungsten carbide support member and a hard cutting layer bonded to the end of the support member. The hard cutting layer is typically made of polycrystalline diamond (PD) or other superabrasive material such as cubic boron nitride, thermally stable diamond, polycrystalline cubic boron nitride, or ultrahard tungsten carbide (meaning a tungsten carbide material having a wear-resistance that is greater than the wear-resistance of the material forming the substrate) as well as mixtures or combinations of these materials. The support member is received and secured in a pocket formed in the surface of one of the several blades with the cutting layer exposed on one end. For convenience, as used herein, reference to "PDC bit" or "PDC cutter element" refers to a fixed cutter bit or cutting element employing a hard cutting layer of polycrystalline diamond or other superabrasive material such as cubic boron nitride, thermally stable diamond, polycrystalline cubic boron nitride, or ultrahard tungsten carbide.

Conventionally, the hard cutting layer of PD is formed by subjecting a graphite powder containing catalysts such as cobalt (Co) or nickel (Ni) to high temperature and pressure conditions to transform it into a diamond powder comprising a plurality of irregularly and inconsistently-shaped crystals. The resulting diamond powder is then, for example, applied to a tungsten carbide support member by way of a sintering or other thermo-mechanical process to form a PDC cutter element.

During drilling operations, cutter elements experience relatively high temperatures due, at least in part, to the general nature of the downhole environment and friction between the cutter elements and the formation. The thermal loads result in expansion of the material components of the cutter elements. Due to differences in the coefficients of thermal expansion between the binding agent and the diamond grains, at sufficiently high temperatures, undesirable cracks may form in the PD layer. Such cracks can lead to failure of the cutter element, reduced cutting efficiency and reduced cutting effectiveness. Accordingly, prior to the diamond powder being sintered to form the PD layer, it is usually leached to remove the catalyst (e.g., Co or Ni). The PD layer may also be leached after formation to remove catalyst (e.g., Co) that infiltrated the PD layer from the tungsten carbide substrate during the sintering process. However, leaching may not remove all of the catalyst, and thus, the PD layer may be susceptible to undesirable cracking during drilling operations.

BRIEF SUMMARY OF THE DISCLOSURE

In an embodiment, a method for forming a single crystal element, the method comprising: (a) transforming a graphite powder into a CVD diamond powder; (b) growing a plurality of CVD single diamond crystals on a substrate; and (c) removing at least a portion of the CVD single diamond crystals from the substrate after (b). The embodiment further comprising (d) transforming the removed CVD single diamond crystals into a CVD single diamond crystal powder; (e) disposing the CVD single diamond crystal powder and a tungsten carbide support element into a mold; and (f) thermo-mechanically processing the CVD single diamond crystal powder in the mold to form a solid CVD single diamond crystal table secured to the tungsten carbide support element.

In an embodiment, a method for forming a cutter element for a fixed cutter drill bit, the method comprising: (a) transforming a graphite powder by hot-filament chemical vapor deposition (HFCVD) into a CVD single diamond crystal powder; (b) growing a plurality of CVD single diamond crystals on a planar surface of a substrate, wherein the plurality of CVD single crystals grow in at least one layer on the substrate; (c) removing at least a portion of the plurality of CVD single diamond crystals from the substrate in the form of a plurality of discrete intact sheets of CVD single diamond crystals; (d) disposing at least some discrete intact sheets of the plurality of discrete intact sheets into a mold; (e) thermo-mechanically processing the at least some discrete intact sheets in the mold; and (f) forming a solid CVD single diamond crystal table during (e).

In an embodiment, a drill bit for drilling a borehole in earthen formations, the bit comprising: a bit body having a bit axis and a bit face; a first blade extending radially along the bit face; a plurality of cutter elements mounted to the first primary blade, wherein each of the plurality of cutter elements comprises a tungsten carbide support member and a CVD single crystal diamond table bonded to an end of the tungsten carbide support member.

Embodiments described herein comprise a combination of features and advantages intended to address various shortcomings associated with certain prior devices, systems, and methods. The foregoing has outlined rather broadly the features and technical advantages of the invention in order that the detailed description of the invention that follows may be better understood. The various characteristics described above, as well as other features, will be readily apparent to those skilled in the art upon reading the following detailed description, and by referring to the accompanying drawings. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a more detailed description of the preferred embodiments, reference will now be made to the accompanying drawings, wherein.

DETAILED DESCRIPTION OF THE PREFERRED EMBODIMENTS

Figure 1:
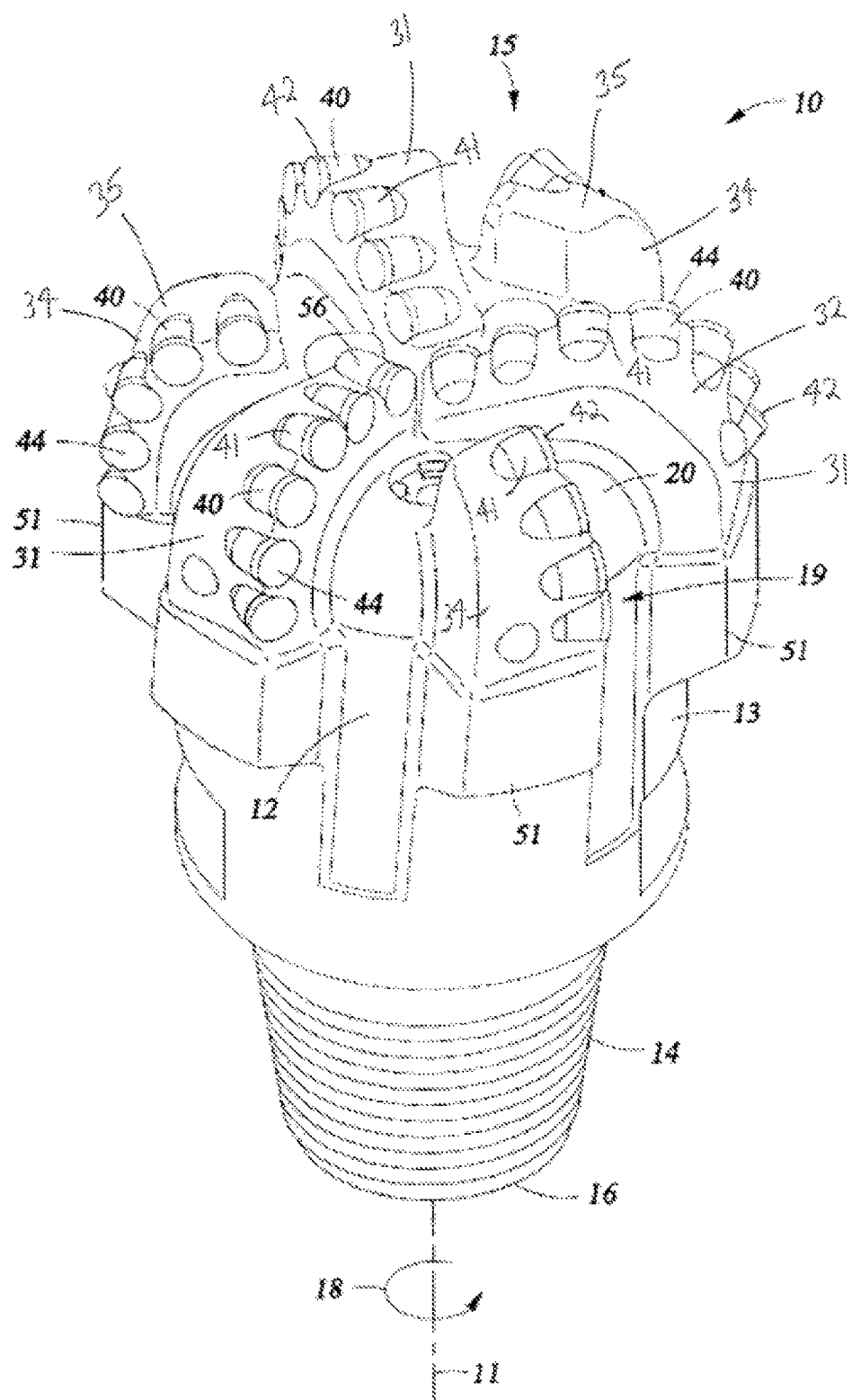
FIG. 1 is a perspective view of an embodiment of a fixed cutter drill bit made in accordance with the principles described herein.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis.

Figure 2:
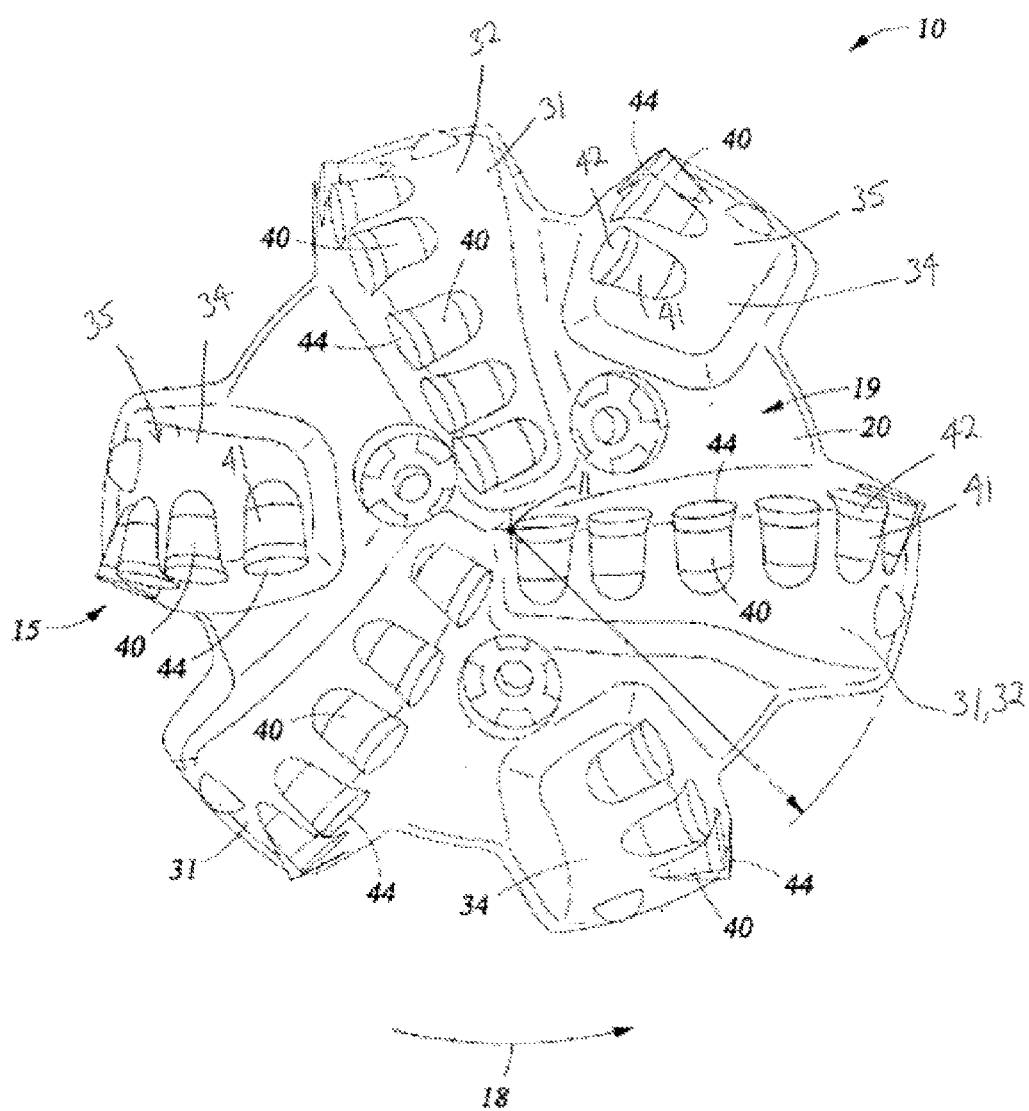
FIG. 2 is a top view of the bit of FIG. 1.

Referring now to FIGS. 1 and 2, an embodiment of a drill bit 10 is shown. In this embodiment, bit 10 is a fixed cutter bit, also referred to as a drag bit, for drilling through earthen formations to form a borehole. Bit 10 has a central axis 11 and includes a bit body 12, a shank 13, and a threaded connection or pin 14 for connecting bit 10 to a drill string or bottom hole assembly (BHA). Bit body 12 defines a bit face 20 that faces the formation generally opposite pin 16. A cutting structure 15 is disposed on the bit face for engaging and cutting the formation when weight-on-bit (WOB) is applied and bit 10 is rotated in a cutting direction 18 about axis 11. In general, body 12 may be formed in a conventional manner using powdered metal tungsten carbide particles in a binder material to form a hard metal cast matrix or machined from a metal block, such as steel.

Referring still to FIGS. 1 and 2, cutting structure 15 includes a plurality of angularly-spaced primary blades 31 and a plurality of secondary blades 34 which extend from bit face 20. Primary blades 31 and secondary blades 34 are circumferentially arranged in an alternating fashion. Although bit 10 is shown as having three primary blades 31 and three secondary blades 34, in general, bit 10 may comprise any suitable number of primary and secondary blades.

Primary blades 31 and secondary blades 34 are integrally formed as part of, and extend from, bit body 12. In addition, primary blades 31 and secondary blades 34 extend generally radially along bit face 20 and then axially along a portion of the periphery of bit 10. In particular, primary blades 31 extend radially from proximal central axis 11 toward the periphery of bit 10, whereas secondary blades 34 are not positioned proximal bit axis 11, but rather, extend radially along bit face 20 from a location that is distal bit axis 11 toward the periphery of bit 10. Primary blades 31 and secondary blades 34 are separated by drilling fluid flow courses 19.

Referring still to FIGS. 1 and 2, each primary blade 31 includes a cutter-supporting surface 32 for mounting a plurality of cutter elements 40, and each secondary blade 34 includes a cutter-supporting surface 35 for mounting a plurality of cutter elements 40, each having a primary cutting face 44. In particular, cutter elements 40 are arranged adjacent one another in a radially extending row proximal the leading edge of each primary blade 31 and each secondary blade 34.

Each cutter element 40 is mounted such that its cutting face 44 is generally forward-facing. As used herein, "forward-facing" is used to describe the orientation of a surface that is substantially perpendicular to, or at an acute angle relative to, the cutting direction of the bit (e.g., cutting direction 18 of bit 10). For instance, a forward-facing cutting face (e.g., cutting face 44) may be oriented perpendicular to the cutting direction of bit 10, may include a backrake angle, and/or may include a siderake angle. However, the cutting faces are preferably oriented perpendicular to the direction of rotation of bit 10 plus or minus a 45° backrake angle and plus or minus a 45° siderake angle. In addition, each cutting face 44 includes a cutting edge adapted to positively engage, penetrate, and remove formation material with a shearing action, as opposed to the grinding action utilized by impregnated bits to remove formation material. Such cutting edge may be chamfered or beveled as desired. In this embodiment, cutting faces 44 are substantially planar, but may be convex or concave in other embodiments.

In this embodiment, each cutter element 40 is the same. In particular, each cutter element 40 comprises an elongated and generally cylindrical support member or substrate 41 and a disk-shaped, hard cutting layer or table 42 of superabrasive material bonded to the exposed end of support member 41. Each table 42 defines the cutting face 44 of the corresponding cutter element 40. In addition, each support member 41 is received and secured in a pocket formed in the cutter-supporting surface 32, 35 of the blade 31, 34 to which it is mounted. In this embodiment, support members 41 are made of tungsten carbide and tables 42 are made of a plurality of single synthetic diamond crystals formed by chemical vapor deposition (CVD), which may also be referred to herein as "CVD diamond(s)" or "CVD single crystal diamond(s)".

In this embodiment, each cutter element 40 has substantially the same cylindrical geometry and size. In particular, each primary cutting face 44 has substantially the same diameter. For an exemplary bit 10 having an overall gage diameter of 7.875 in. (~20 cm), the diameter of each cutting face 44 is about 0.625 in. (~16 mm). In other embodiments, the geometry and/or size of one or more cutting face may be different.

Referring still to FIGS. 1 and 2, bit 10 also includes gage pads 51 of substantially equal axial length measured generally parallel to bit axis 11. Gage pads 51 are circumferentially-spaced about the periphery of bit 10, one gage pad 51 intersecting and extending from each blade 31, 34. In this embodiment, gage pads 51 are integrally formed as part of the bit body 12. Gage pads 51 abut the sidewall of the borehole during drilling and help maintain the size of the borehole by a rubbing action when cutter elements 40 wear slightly under gage. Gage pads 51 also help stabilize bit 10 against vibration. As one skilled in the art will appreciate, numerous variations in the size, orientation, and locations of the blades (e.g., primary blades 31, secondary blades, 34, etc.), cutter elements (e.g., cutter elements 40), and gage pads (e.g., pads 51) are possible.

Figure 3:
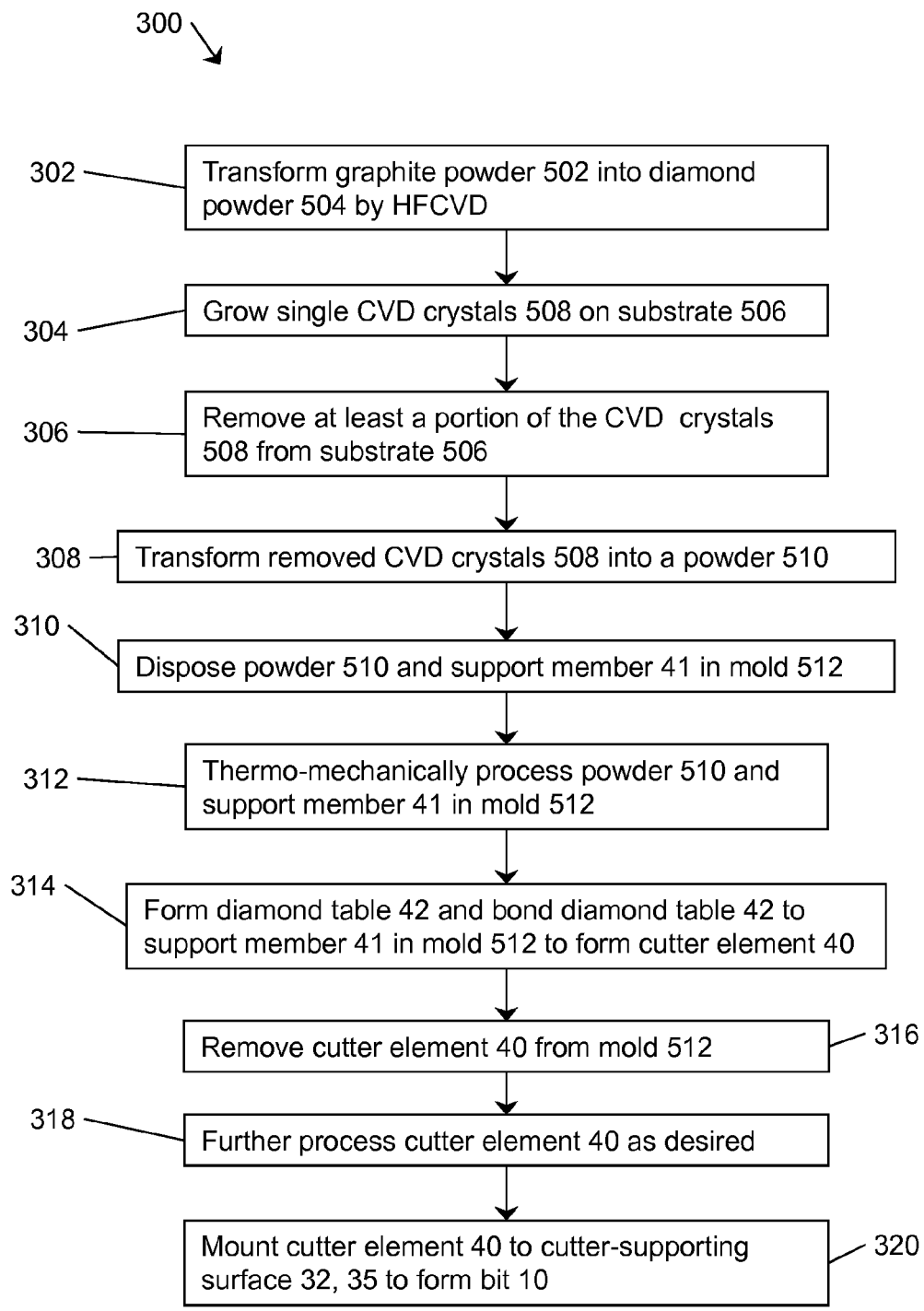
FIG. 3 is a graphical illustration of an embodiment of a method for forming one cutter element of the bit of FIG. 1 having a hard cutting table made from CVD single crystal diamond powder.
Figure 4:
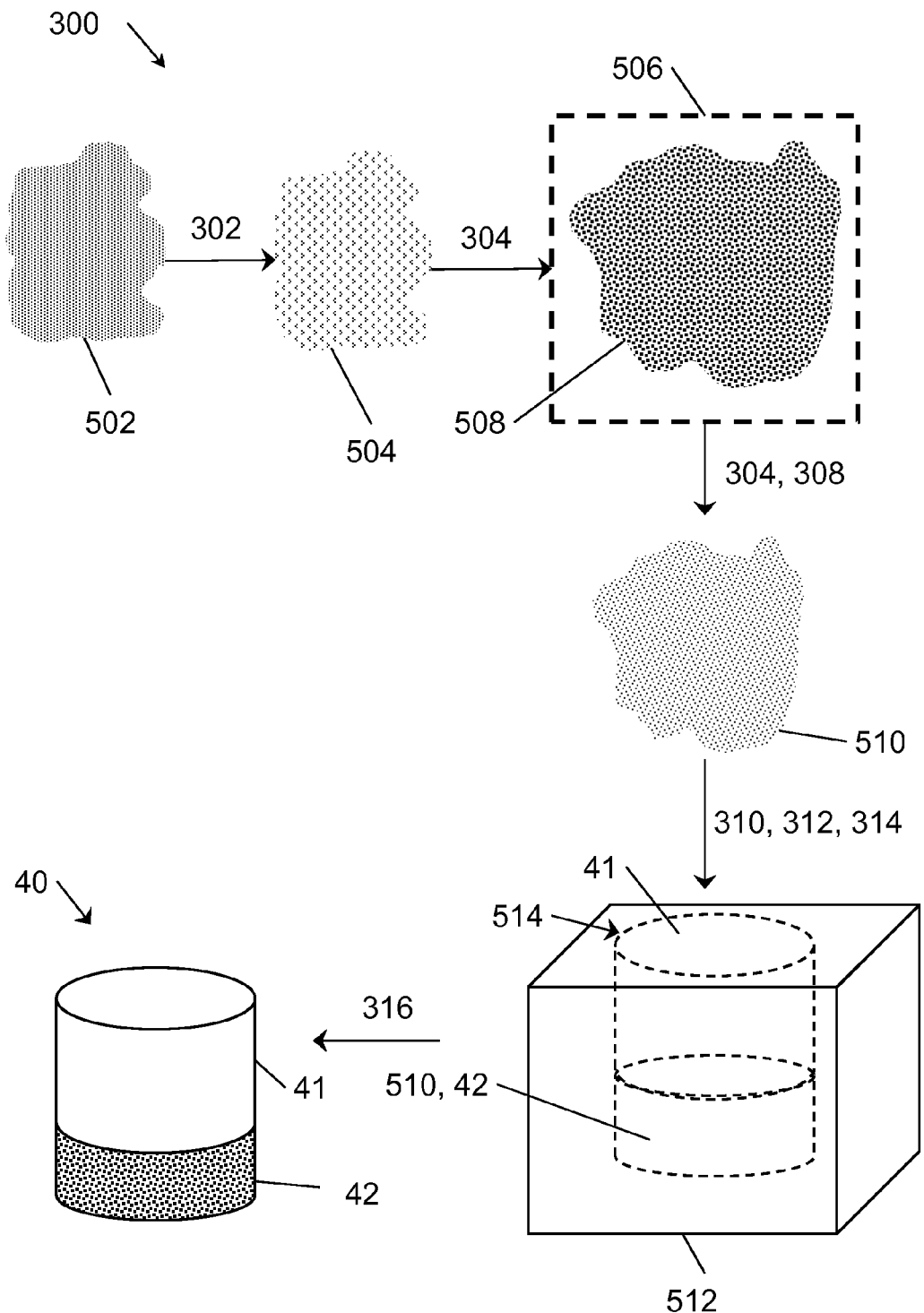
FIG. 4 is a schematic pictorial illustration of the method of FIG. 3.

Referring now to FIGS. 3 and 4, an embodiment of a method 300 for forming one cutter element 40 as previously described is shown. In this embodiment, table 42 of cutter element 40 is made by sintering CVD single crystal diamond powder. Starting at block 302, a graphite powder 502 is converted into a single crystal diamond powder 504 by, for example, a high temperature, high pressure process such as hot-filament chemical vapor deposition (HFCVD). A single crystal diamond powder comprises a plurality of single crystals, the size of which may depend on the application. Although graphite powder 502 is used as the starting material in this embodiment, in other embodiments, a solid graphite block, smaller graphite cubes, irregularly shaped pieces of graphite, or other suitable form(s) of graphite can be used as the starter material. It should be appreciated that graphite powder 502 may not completely convert into single crystal diamond powder 504, and thus, after conversion, the powder 504 is preferably sorted to remove any remaining, unconverted graphite powder 502 (or other starter material).

At block 304, the single crystal diamond powder 504 is then grown via chemical vapor deposition (CVD) as a plurality of CVD single diamond crystals 508 on a substrate 506. Alternatively, in some embodiments, the graphite powder 502 can be directly converted into a plurality of CVD diamond crystals 508 without formation of the intermediate single crystal diamond powder 504. In either case, each CVD single crystal diamond of the plurality of CVD single diamond crystals 508 has the same shape. In an embodiment, each CVD single diamond crystal 508 has a rectangular prismatic shape (e.g., cubic) with six sides. Each side has a length and width between about 10 microns and about 20 microns.

In this embodiment, substrate 506 acts as the catalyst for the single crystal growth at block 304. In particular, substrate 506 is preferably made of cobalt (Co), nickel (Ni), iron (Fe), tungsten (W), molybdenum (Mo), or alloys thereof. Such metals operate, at least initially, as catalysts for CVD single diamond crystals 508 growth on the substrate 506. Since the substrate 506 operates initially as a catalyst for single-crystal growth, embodiments described herein offer the potential to reduce or eliminate the need to add catalyst to powder 502 to initiate crystal growth.

In this embodiment, substrate 506 is a non-planar three-dimensional growth surface, for example, a dowel, a pin, a convex or concave surface, or other feature shaped as a semi-circle, sphere, square, rectangle, trapezoid, cone, teardrop, or combinations thereof. As will be described in more detail below, in other embodiments, the single crystals (e.g., CVD single diamond crystals 508) are grown on a two-dimensional flat surface of a substrate in at least one layer.

After the plurality of CVD single diamond crystals 508 are grown on the substrate 506 at block 304, at least a portion of the plurality of CVD single diamond crystals 508 are removed from substrate 506 at block 306. In this embodiment, the plurality of CVD single diamond crystals 508 are mechanically removed from the substrate 506 and converted into a CVD diamond crystal powder 510 at block 308. In general, the plurality of CVD single diamond crystals 508 can be mechanically removed and converted into powder 510 by crushing, scraping, grinding, or the like.

Referring still to FIG. 3, at block 310, the CVD single crystal diamond powder 510 formed at block 308 is disposed in a recess 514 of a mold 512, and a solid tungsten carbide support member 41 is placed in the mold on top of the powder 510. Support member 41 and the CVD single crystal diamond powder 510 in mold 512 are then subjected to high pressure and high temperature conditions at block 312 to form cutter element 40 at block 314 by simultaneously (a) sintering the CVD single crystal diamond powder 510 into a monolithic or unitary solid CVD single crystal diamond table 42 made entirely of CVD single crystal diamonds, and (b) bonding the diamond table 42 to support member 41.

Cutter element 40 including the solid CVD single crystal diamond table 42 is removed from mold 512 at block 316, and may undergo further treatment or processing at block 318 before being mounted to a cutter-supporting surface 32, 35 at block 320 to form bit 10. For example, the mold 512 and/or support member 41 may act as a catalyst for the formation of the solid single crystal diamond table 42—metal catalyst in the mold 512 and/or support member 41 may infiltrate CVD diamond table 42 during formation of cutter element 40 in block 314. Accordingly, leaching is preferably performed in block 318 to remove at least some of the catalysts that infiltrate table 42 during formation of cutter element 40 at block 314. As another example, the diamond table 42 may be further processed in block 318 to conform table 42 to specific dimensions.

Figure 5:
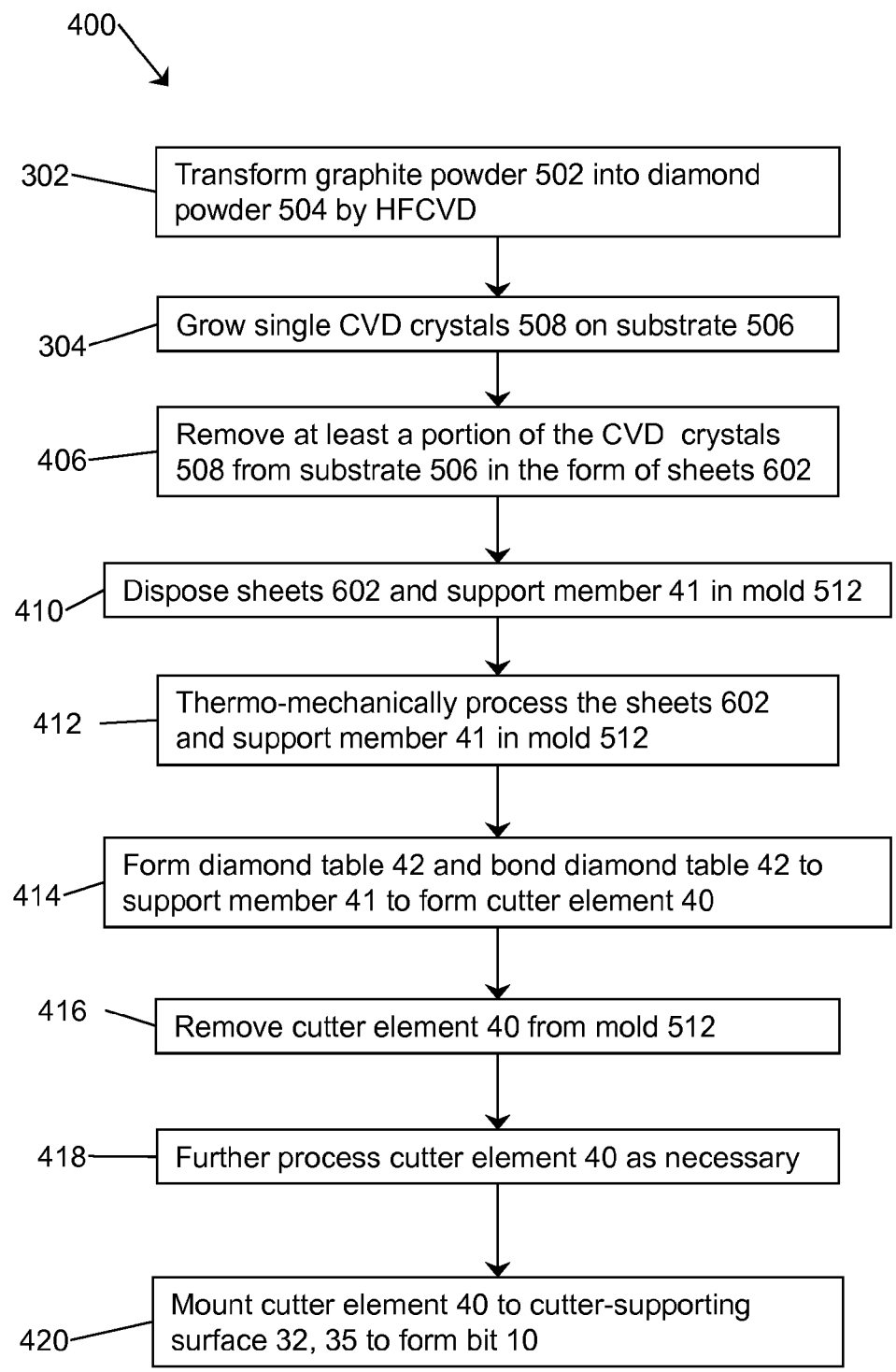
FIG. 5 is a graphical illustration of an embodiment of a method for forming one cutter element of the bit of FIG. 1 having a hard cutting table made from a plurality of stacked CVD single crystal diamond layers.
Figure 6:
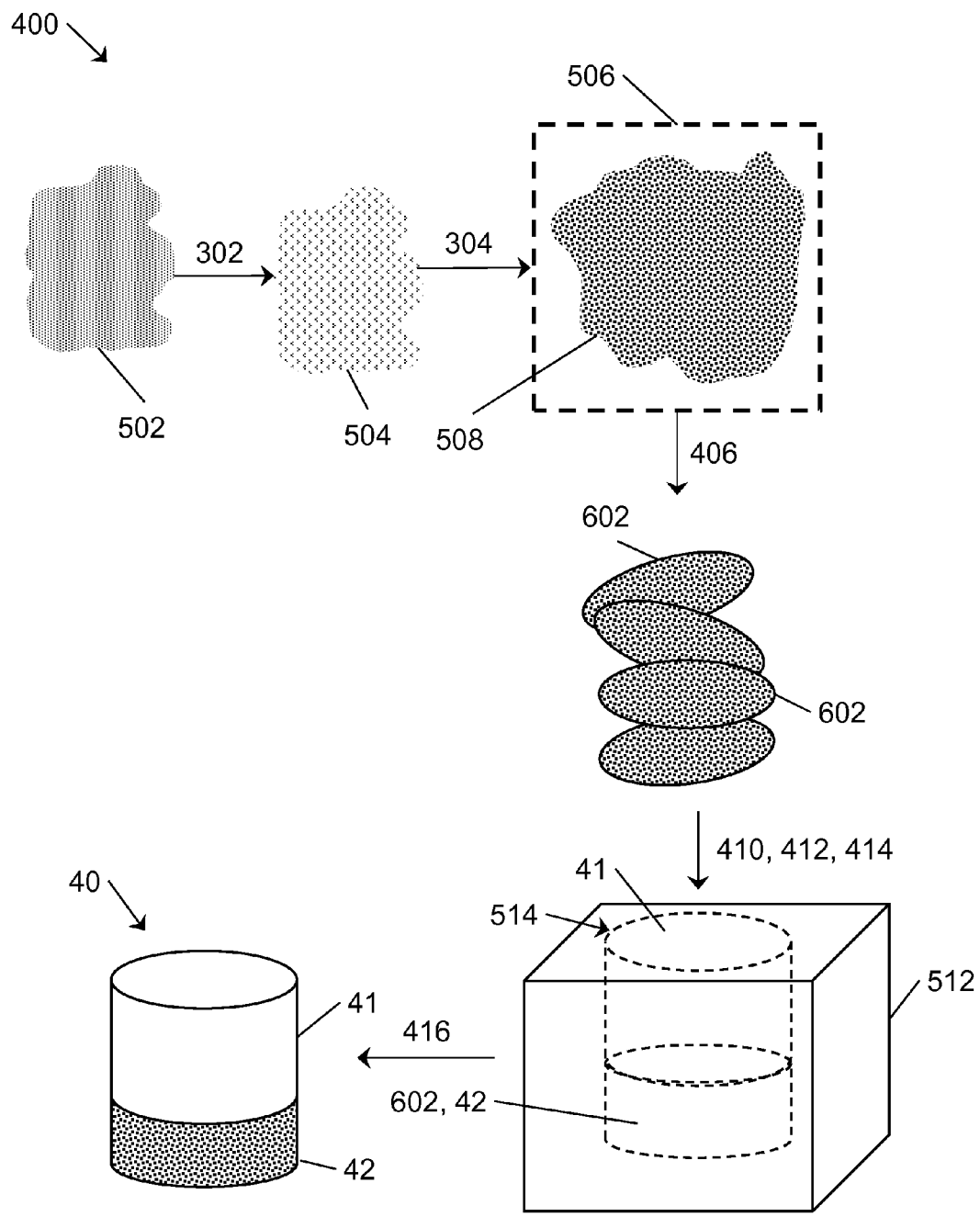
FIG. 6 is a schematic pictorial illustration of the method of FIG. 5.

Referring now to FIGS. 5 and 6, an embodiment of a method 400 for forming one cutter element 40 as previously described is shown. In this embodiment, table 42 of cutter element 40 is made by sintering stacked layers of CVD single crystal diamonds. Similar to method 300 previously described, method 400 begins at blocks 302, 304, where graphite powder 502 is converted into single crystal diamond powder 504 by, for example, HFCVD, and then, the single crystal diamond powder 504 is then grown via chemical vapor deposition (CVD) as plurality of CVD single diamond crystals 508 on a substrate 506. As previously described, each CVD single diamond crystal of the plurality of CVD single diamond crystal 508 has a uniform shape. More specifically, each CVD single diamond crystal 508 has a rectangular prismatic shape (e.g., cubic) with six sides. Each side has a length and width between 10 microns and 20 microns. However, in this embodiment, the plurality of CVD single diamond crystals 508 are grown in at least one layer on planar or flat surface of substrate 506. In general, substrate 506 can be two-dimensional or three dimensional, and the plurality of CVD single diamond crystals may be grown on any or all surfaces as appropriate given the respective surface area of each surface. Substrate 506 operates, at least initially, as catalysts for CVD single diamond crystal growth on the substrate 506. Accordingly, as previously described, substrate 506 is preferably made of cobalt (Co), nickel (Ni), iron (Fe), tungsten (W), molybdenum (Mo), or alloys thereof. The growth directly on the substrate 506 is initiated by the substrate 506 itself since it acts as a catalyst, and subsequent layers of crystals may grow on the initially layer formed on the substrate 506.

At block 304, after the layer(s) of CVD single diamond crystals 508 are grown on the substrate 506, at least a portion of the plurality of CVD single diamond crystals 508 are removed from the substrate 506 at block 406. In this embodiment, the removal process does not damage or crush the plurality of CVD single diamond crystals 508 as in block 306 of method 300 previously described. Rather, in this embodiment, at block 406, a plurality of in-tact sheets 602 of the CVD single diamond crystals 508 are stamped, cut or otherwise removed from the substrate with minimal damage to the edges of the removed portion during the removal process at block 406. Each sheet of the plurality of in-tact sheets 602 can comprise one or more layers of the CVD single diamond crystals 508.

Referring still to FIGS. 5 and 6, the plurality of sheets 602 removed at block 406 are disposed in recess 514 of the mold 512 at block 410, and support member 41 is placed in recess 514 on top of the stack of sheets 602. Within recess 514, the plurality of sheets 602 are preferably arranged in a vertical stack one on-top of the other, however, in general, the sheets (e.g., sheets 602) can be arranged in other orientations (e.g., arranged in a horizontal row one next to the other, or at any other angle as appropriate to the subsequent processing and/or end application). The support member 41 and the CVD single crystal diamond sheets 602 in mold 512 are then subjected to high pressure and high temperature conditions in block 412 to form cutter element 40 at block 414 by simultaneously (a) sintering sheets 602 into a monolithic or unitary solid CVD single crystal diamond table 42 made entirely of CVD single diamond crystals, and (b) bonding the diamond table 42 to support member 41. The cutter element 40 including the solid CVD single crystal diamond table 42 is removed from mold 512 at block 416, and may undergo further treatment or processing (e.g., leaching) in block 418 before being mounted to a cutter-supporting surface 32, 35 at block 420 to form bit 10. In particular, a catalyst such as cobalt (Co), iron (Fe), nickel (Ni), or combinations thereof, in the support member 41 may infiltrate the CVD diamond table 42 during formation of cutter element 40 in block 414, and thus, leaching is preferably performed in block 418 to remove the catalyst from table 42.

In the conventional method for making cutter element described above, the [111] plane of the irregularly-shaped particles in the polycrystalline diamond powder may be the cleavage plane and therefore the weakest plane. However, using embodiments of methods 300, 400 disclosed herein, the growth planes of the plurality of CVD single diamond crystals 508 can be controlled so that the crystals are grown on the substrate 506 along a specific plane. In a preferred embodiment, the plurality of CVD single diamond crystals 508 with a [100] orientation are grown on the substrate 506. It should be appreciated that the growth of [100] single crystals may be tightly controlled to ensure that the growth does not transition to a polycrystalline structure. This directional crystal growth may lead to increased strength under high temperatures and pressures and, as such, result in decreased failure of components under high temperature and/or high pressure.

In the conventional method of forming diamond powder for use in making the PD table, a catalyst such as cobalt (Co) or nickel (Ni) is typically added to the starter graphite powder to help facilitate the growth of diamond crystals. However, such catalysts operate as undesirable impurities or contaminants in the PD tables. In particular, the catalyst and diamond crystals have different coefficients of thermal expansion, and thus, when the PD table is subjected to high temperature conditions, differences in the expansion of the catalysts and diamond may lead to cracks within the table. Consequently, the diamond powder is leached to remove the catalyst. However, in the methods disclosed herein (e.g., methods, 300, 400), catalysts are not added to the starting graphite powder (e.g., powder 502). Rather, initially, the substrate (e.g., substrate 506) functions as a catalyst to initiate diamond growth, and once initiated, the diamond growth continues on its own. Consequently, it may not be necessary to leach CVD diamond powder 510. It should be appreciated that catalyst in the support member 41 may infiltrate the CVD diamond table 42 during formation of cutter element 40 in mold 512, and thus, leaching is preferably performed in blocks 318, 418 to remove the catalyst from table 42.

In the manner described, cutter elements 40 with tungsten carbide support members 41 and CVD diamond table 42 can be formed, and then mounted to surfaces 32, 35 to form bit 10. In methods 300, 400, powder 510 or sheets 602 are placed in mold 512 along with a tungsten carbide support member 41 to form cutter element 40. However, other CVD single diamond crystal components of any desired shape can be formed in a mold (e.g., mold 512) in a similar manner. If such other CVD single diamond crystal components are to be bonded to a second component (e.g., a tungsten carbide substrate), that second component can be placed in the mold with the CVD single diamond material (e.g., powder 510 or sheets 602). Alternatively, the other the CVD single diamond material component can be formed on its own in the mold, and then secured to a second component or device.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the invention. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A method for forming a cutter element for a drill bit, the method comprising:
    (a) transforming a graphite powder into a CVD diamond powder;
    (b) growing a plurality of CVD single crystal diamonds on a substrate, wherein the plurality of CVD single crystal diamonds are grown in an orientation along the [100] crystallographic plane;
    (c) removing at least a portion of the CVD single crystal diamonds from the substrate after (b);
    (d) transforming the removed CVD single crystal diamonds into a CVD single crystal diamond powder, wherein the CVD single crystal diamond powder comprises a plurality of CVD single crystal diamonds, wherein each CVD single crystal diamond of the plurality of CVD single crystal diamonds is a rectangular cube, wherein each side of each rectangular cube has a width between 10 and 20 microns;
    (e) disposing the CVD single crystal diamond powder and a tungsten carbide support element into a mold; and
    (f) thermo-mechanically processing the CVD single crystal diamonds powder in the mold to form a solid CVD diamond crystal table secured to the tungsten carbide support element, wherein the solid CVD diamond crystal table comprises a plurality of single crystal diamonds.

2. The method of claim 1, wherein the substrate comprises a catalyst, and wherein (b) comprises initiating the growth of the plurality of CVD single crystal diamonds with the catalyst.

3. The method of claim 2, wherein the substrate is a dowel.

4. The method of claim 3, wherein the substrate comprises cobalt (Co), nickel (Ni), iron (Fe), tungsten (W), and molybdenum (Mo), or an alloy thereof.

5. The method of claim 1, further comprising leaching the solid CVD diamond crystal table after (f).

6. The method of claim 1, wherein (a) comprises transforming the graphite powder into a CVD diamond powder by hot-filament chemical vapor deposition (HFCVD).

* * * * *